US008927389B2

(12) United States Patent
Byun et al.

(10) Patent No.: US 8,927,389 B2
(45) Date of Patent: Jan. 6, 2015

(54) SEMICONDUCTOR DEVICES AND METHODS OF FABRICATING THE SAME

(75) Inventors: Kyungmun Byun, Seoul (KR); Byoungdeog Choi, Suwon-si (KR); Eunkee Hong, Seongnam-si (KR); Mansug Kang, Suwon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 273 days.

(21) Appl. No.: 13/369,476

(22) Filed: Feb. 9, 2012

(65) Prior Publication Data

US 2012/0252182 A1 Oct. 4, 2012

(30) Foreign Application Priority Data

Mar. 30, 2011 (KR) .......................... 10-2011-0029043

(51) Int. Cl.
*H01L 21/00* (2006.01)
*H01L 27/105* (2006.01)
*H01L 27/108* (2006.01)
*H01L 29/94* (2006.01)
*H01L 21/762* (2006.01)
*H01L 27/115* (2006.01)

(52) U.S. Cl.
CPC ..... *H01L 21/76229* (2013.01); *H01L 27/11531* (2013.01); *H01L 27/1052* (2013.01); *H01L 27/10894* (2013.01); *H01L 29/945* (2013.01)
USPC ........................................ 438/427; 438/296

(58) Field of Classification Search
CPC ..................... H01L 21/76229; H01L 27/1052; H01L 27/10894; H01L 29/945
USPC .................. 438/258, 275–277, 296, 424–427
See application file for complete search history.

(56) References Cited

U.S. PATENT DOCUMENTS

| 6,914,316 | B2 | 7/2005 | Yun et al. |
| 2008/0182381 | A1 | 7/2008 | Kiyotoshi |
| 2010/0072569 | A1 | 3/2010 | Han et al. |
| 2010/0087043 | A1 | 4/2010 | Cheng et al. |

FOREIGN PATENT DOCUMENTS

| JP | 2008-103645 | 5/2008 |
| KR | 10-2004-0016695 A | 2/2004 |
| KR | 10-2006-0077486 A | 7/2006 |
| KR | 10-2010-0035000 A | 4/2010 |

*Primary Examiner* — Richard Booth
(74) *Attorney, Agent, or Firm* — Lee & Morse, P.C.

(57) ABSTRACT

A method of fabricating a semiconductor device includes providing a substrate including a first region and a second region, forming a first trench having a first width in the first region and a second trench having a second width in the second region, and the second width is greater than the first width. The method also includes forming a first insulation layer in the first and second trenches, removing the first insulation layer in the second trench to form a first insulation pattern that includes the first insulation layer remaining in the first trench, forming on the substrate a second insulation layer that fills the second trench, and the second insulation layer includes a different material from the first insulation layer.

14 Claims, 16 Drawing Sheets

SEMICONDUCTOR DEVICES AND METHODS OF FABRICATING THE SAME

CROSS-REFERENCE TO RELATED APPLICATION

This U.S. non-provisional patent application claims priority to Korean Patent Application No. 10-2011-0029043, filed on Mar. 30, 2011, in the Korean Intellectual Property Office, and entitled: "Semiconductor Devices and Methods of Fabricating the Same," which is incorporated by reference herein in its entirety.

BACKGROUND

As the electronic industry becomes more highly developed, integration density of semiconductor memory devices has been gradually increased. The integration density of the semiconductor memory devices may act as a factor that influences a cost of the semiconductor memory devices.

SUMMARY

Embodiments may be realized by providing a method of fabricating a semiconductor device that includes providing a substrate including a first region and a second region, forming a first trench having a first width in the first region and a second trench having a second width in the second region, the second width is greater than the first width, forming a first insulation layer in the first and second trenches, removing the first insulation layer in the second trench to form a first insulation pattern that includes the first insulation layer remaining in the first trench, forming on the substrate a second insulation layer that fills the second trench, and the second insulation layer includes a different material from the first insulation layer.

The first insulation layer may be formed to fill the first trench and to provide an empty space surrounded by the first insulation layer in the second trench. The first insulation layer may be formed of a nitride material and the second insulation layer may be formed of a non-nitride material.

The method may include forming a liner layer in the first and second trenches prior to forming the first insulation layer. The method may include removing portions of the second insulation layer on the first region of the substrate to form a second insulation pattern that includes the second insulation layer remaining in the second trench. The method may include forming a variable resistive pattern on the first region of the substrate and forming a semiconductor pillar in the second trench. The semiconductor pillar may penetrate the second insulation pattern and the liner layer.

The liner layer in the first trench and the first insulation pattern may completely fill the first trench. The liner layer in the second trench and the second insulation pattern may completely fill the second trench. The first trench may be one of a plurality of first trenches, the first trenches may define active portions therebetween, and top surfaces of the first insulation patterns may be substantially coplanar with top surfaces of the active portions.

The method may include applying a thermal oxidation process to the first insulation layer to form an assistant layer on the first insulation layer. The assistant layer may fill voids or seams that are surrounded by the first insulation layer in the first trench.

Embodiments may also be realized by providing a semiconductor device that includes a substrate having a first region and a second region, a first trench in the first region has a first width and a second trench in the second region has a second width, and the second width is greater than the first width. The semiconductor device includes a first liner pattern covering a sidewall and a bottom surface of the first trench, a first insulation pattern in the first region surrounded by the first liner pattern in the first trench, the first insulation pattern is in contact with the first liner pattern and is formed of a silicon nitride layer, a second liner pattern covers a sidewall and a bottom surface of the second trench, the second liner pattern includes a same material as the first liner pattern, a second insulation pattern in the second region is surrounded by the second liner pattern in the second trench, and the second insulation pattern is in contact with the second liner pattern and is formed of a different material from the first insulation pattern.

The second insulation pattern and the second liner pattern may include a non-nitride material, and the second insulation pattern and the second liner pattern may completely fill the second trench. The semiconductor device may include a memory element on the first region of the substrate and a peripheral circuit element on the second region of the substrate. The memory element may include a variable resistive pattern. The peripheral circuit element may include a semiconductor pattern penetrating the second insulation pattern and a dielectric pattern between the semiconductor pattern and the bottom surface of the second trench. The first trench and the first insulation pattern may extend in a first direction.

Embodiments may be realizing by providing a method of forming a semiconductor device that includes providing a substrate including a first region and a second region, forming a first trench having a first width in the first region and a second trench having a second width in the second region, and the second width is greater than the first width. The method includes forming a nitride layer on the substrate to form a first nitride layer filling the first trench and a second nitride layer filling the second trench, removing the second nitride layer from the second trench such that the first nitride layer remains in the first trench, and forming a non-nitride layer filling the second trench after removing the second nitride layer from the second trench.

The method may include forming a liner layer in the first and second trenches before forming the nitride layer and the non-nitride layer. The method may include oxidizing the first nitride layer to form an assistant layer such that the liner layer, the first nitride layer, and the assistant layer completely fill the first trench.

The method may include forming a memory element on the first region of the substrate and the memory element may overlap the first trench. The method may include forming a peripheral circuit element on the second region of the substrate and the peripheral circuit element may include a semiconductor pattern that penetrates the non nitride layer. The method may include removing portions of the non-nitride layer outside the second trench such that the non-nitride layer is excluded in the first trench, and the nitride layer may be excluded in the second trench.

BRIEF DESCRIPTION OF THE DRAWINGS

Features will become apparent to those of ordinary skill in the art by describing in detail exemplary embodiments with reference to the attached drawings, in which.

DETAILED DESCRIPTION

Figure 1:
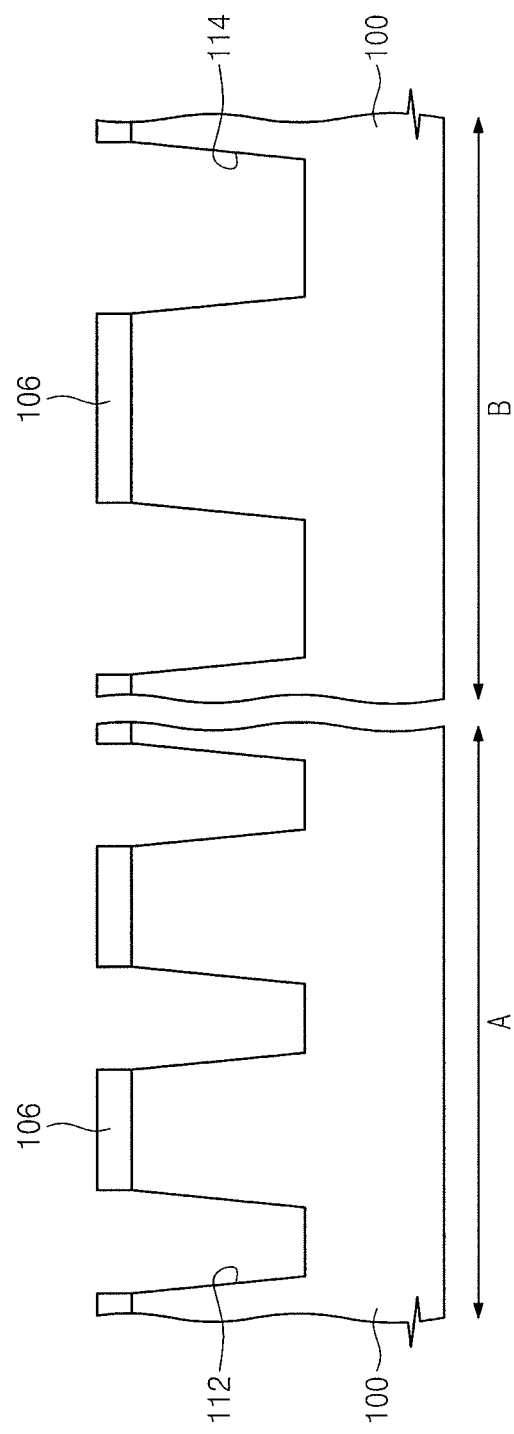
FIGS. 1 to 5 illustrate cross sectional views depicting stages in a method of fabricating a semiconductor device, according to an exemplary embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout. Also it will be understood that when an element is referred to as being "connected" or "coupled" to another element, it may be directly connected or coupled to the other element or intervening elements may be present. The term "directly" means that there are no intervening elements.

The terminology used herein is for the purpose of describing particular embodiments only and is not intended to limit the embodiments. As used herein, the singular terms "a," "an" and "the" are intended to include the plural forms as well, unless the context clearly indicates otherwise. As used herein, the term "and/or" includes any and all combinations of one or more of the associated listed items. It will be further understood that the terms "comprises", "comprising,", "includes" and/or "including", when used herein, specify the presence of stated features, stages, steps, operations, elements, and/or components, but do not preclude the presence or addition of one or more other features, stages, steps, operations, elements, components, and/or groups thereof.

It will be also understood that although the terms first, second, etc. may be used herein to describe various elements, these elements should not be limited by these terms. These terms are only used to distinguish one element from another element. Thus, a first element in some embodiments could be termed a second element in other embodiments without departing from the teachings of the present invention.

Like reference numerals refer to like elements throughout. The exemplary embodiments in the detailed description will be described with sectional views as exemplary views of the embodiments. Accordingly, shapes of the exemplary views may be modified according to, e.g., manufacturing techniques and/or allowable errors. Therefore, the embodiments are not limited to the specific shapes illustrated in the exemplary views, but may include other shapes that may be created according to, e.g., manufacturing processes. Areas exemplified in the drawings may have general properties, and may be used to illustrate exemplary shapes of elements. Thus, this should not be construed as limiting to the scope of the present invention.

FIGS. 1 to 5 illustrates cross sectional views depicting stages in a method of fabricating a semiconductor device, according to a first exemplary embodiment.

Referring to FIG. 1, a substrate 100 including a first region A and a second region B may be prepared. In an embodiment, the first region A may correspond to a cell region in which memory cells are formed, and the second region B may correspond to a peripheral region in which peripheral circuits are formed. The peripheral circuits in the second region B may be connected to the memory cells in the first region A. The substrate 100 may include a semiconductor substrate. For example, the substrate 100 may be a silicon substrate, a germanium substrate, or a silicon-germanium substrate.

A first trench 112 and a second trench 114 may be formed in the first region A and the second region B, respectively. The first trench 112 may have a first width. The second trench 114 may have a second width, e.g., the second width may be greater than the first width. The first and second widths may extend in a first direction, e.g., the first direction may extend in a first direction that extends between the first and second trenches 112 and 114. According to an exemplary embodiment, widths of the first and second trenches 112 and 114 may be gradually reduced as a distance from a bottom surface of the substrate 100 decreases. A maximum width of the first trench 112 may be less than a maximum width of the second trench 114. For example, the first trench 112 may have a maximum width of, e.g., about 40 nm. The second trench 114 may have a maximum width of, e.g., about 120 nm.

A minimum width of the first trench 112 may be less than a minimum width of the second trench 114. For example, the first trench 112 may be a narrow trench and the second trench 114 may be a wide trench so that the first trench 112 is narrower than the second trench 114. A mean value of the width of the first trench 112 may be less than a mean value of the width of the second trench 114.

According to an exemplary embodiment, the first and second trenches 112 and 114 may be formed by forming a mask pattern 106 on the substrate 100 and etching the substrate 100 using the mask pattern 106 as an etch mask.

Figure 2:
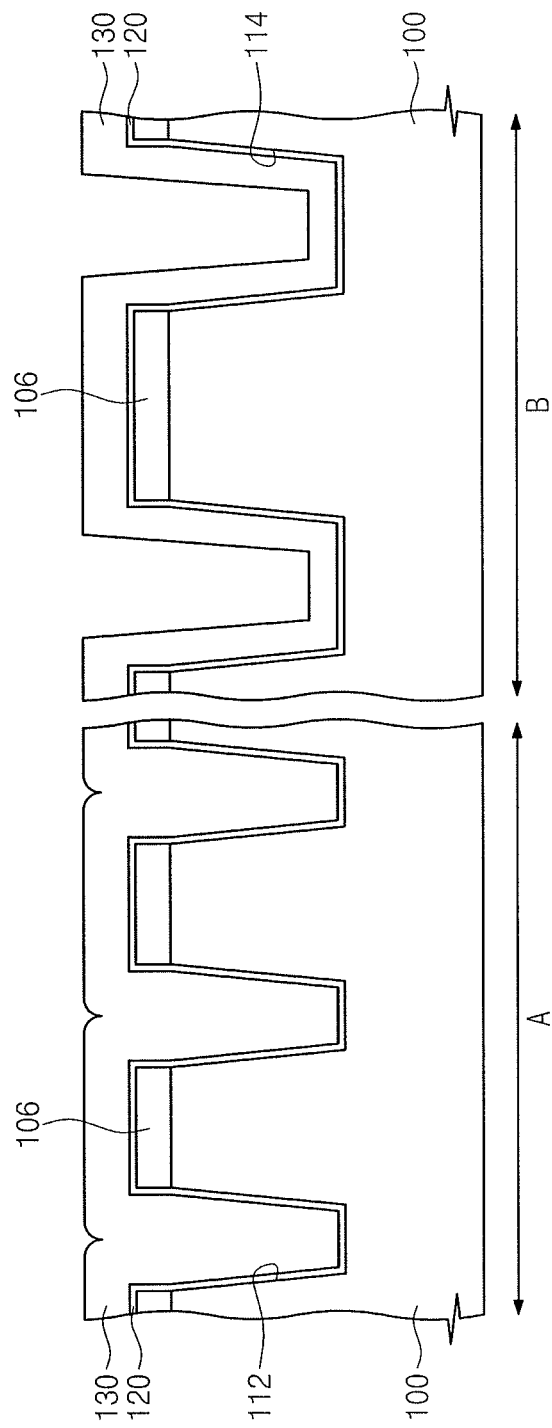

Referring to FIG. 2, a liner layer 120 may be formed on the substrate 100 including the first and second trenches 112 and 114. The liner layer 120 may also be formed on mask pattern 106. The liner layer 120 may be formed to have a thickness which is less than a half of the minimum width of the first trench 112. For example, the liner layer 120 may be formed to conformally cover sidewalls and bottom surfaces of the first and second trenches 112 and 114. The liner layer 120 may conformally cover an upper surface and side surfaces of the mask pattern 106, e.g., so that the liner layer 120 may be a continuous layer on the first and second regions A and B of the substrate 100. Inner spaces surrounded by the liner layer 120 may still exist in the first and second trenches 112 and 114, e.g., so that the liner layer 120 may not completely fill the first and second trenches 112 and 114.

The liner layer 120 may be, e.g., an insulating layer. For example, the liner layer 120 may include a silicon oxide layer. The liner layer 120 may be formed using, e.g., a deposition process. Alternatively, the liner layer 120 may be formed using, e.g., a thermal oxidation process.

After formation of the liner layer 120, a first insulation layer 130 may be formed on the substrate 100 having the liner layer 120 thereon. For example, the first insulation layer 130 may be formed directly on the liner layer 120 as a continuous layer in both the first region A and the second region B. The first insulation layer 130 may be formed to a thickness which is equal to or greater than a half of the maximum width of the first trench 112. For example, the first insulation layer 130 may be formed to completely fill the first trench 112 that includes the liner layer 120. The thickness of the first insulation layer 130 may be less than a half of the minimum width of the second trench 114 and/or a half of the maximum width of the second trench 114. Thus, inner spaces surrounded by the first insulation layer 130 may still exist in the second trench 114 so that the first insulation layer 130 may not completely fill the second trench 114.

The first insulation layer 130 may be formed of, e.g., a different material from the liner layer 120. For example, in the event that the liner layer 120 is formed of a non-nitride layer (e.g., a silicon oxide layer), the first insulation layer 130 may be formed of a nitride layer, e.g., a silicon nitride layer. The non-nitride layer may be construed as a nitrogen free material.

Figure 3:
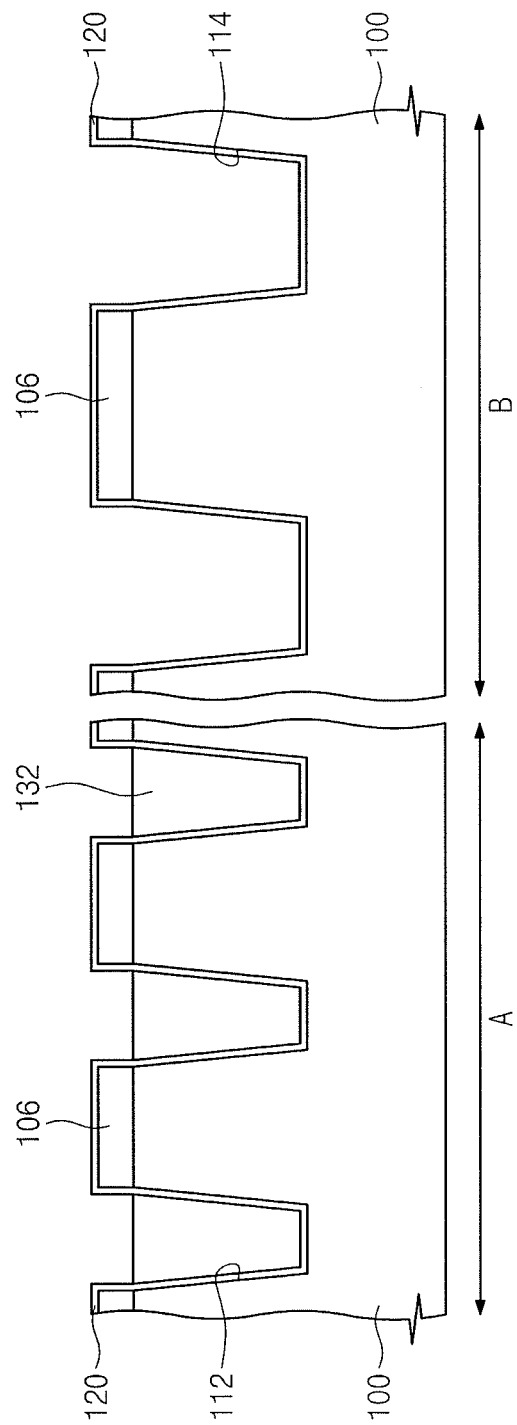

Referring to FIG. 3, the first insulation layer 130 in the second trench 114 may be removed, and the first insulation layer 130 in the first region A may be recessed to form a first insulation pattern 132 remaining in the first trench 112. In an exemplary embodiment, the removal of the first insulation layer 130 in the second trench 114 and the recession of the first insulation layer 130 in the first trench 112 may be simultaneously performed using, e.g., a wet etch process.

The first insulation pattern 132 may correspond to a portion of the first insulation layer 130 left in the first trench 112 after removal of the first insulation layer 130 in the second trench 114. The first insulation pattern 132 may completely fill the space surrounded by the liner layer 120 in the first trench 112. The first insulation pattern 132 may have an upper surface that is below an upper surface of the mask pattern 106. In an exemplary embodiment, a top surface of the first insulation pattern 132 may be at a level near a top surface of the substrate 100, e.g., the top surface of the first insulation pattern 132 may be substantially coplanar with the top surface of the substrate 100. In another exemplary embodiment, the top surface of the first insulation pattern 132 may be located at a higher level than the top surface of the substrate 100.

The first insulation layer 130 in the second trench 114 may be removed, e.g., completely removed. Thus, the liner layer 120 in the second trench 114 may be exposed after removal of the first insulation layer 130 in the second trench 114.

Figure 4:
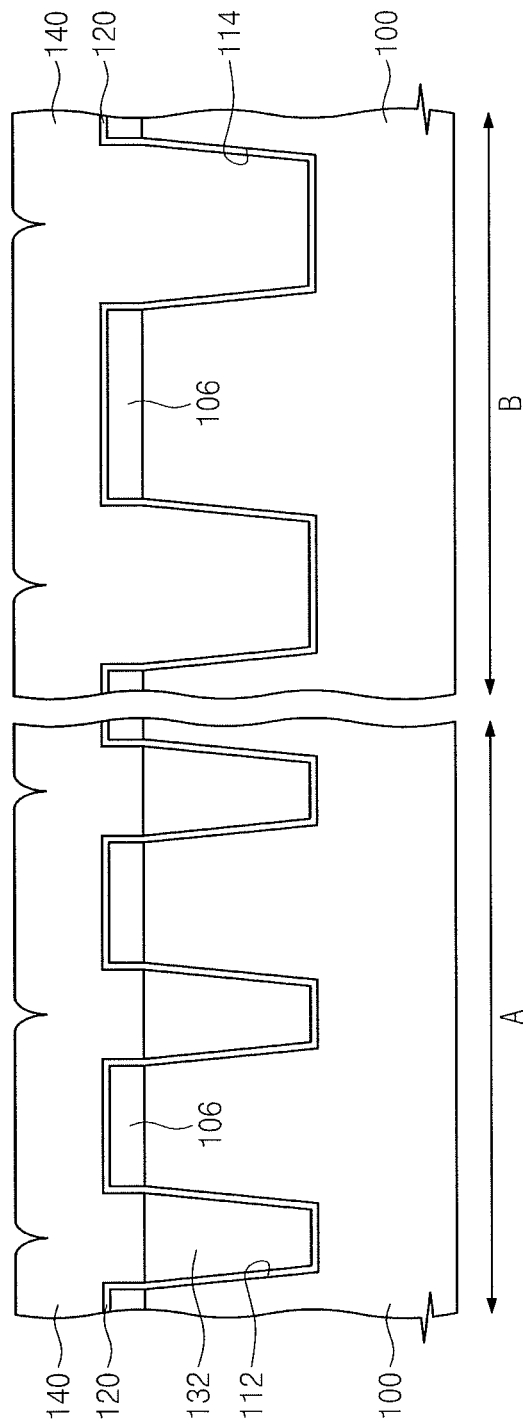

Referring to FIG. 4, a second insulation layer 140 may be formed on the substrate having the first insulation pattern 132. The second insulation layer 140 may be formed on both the first region A and the second region B as one continuous layer.

In the first region A, the second insulation layer 140 may be formed on the first insulation pattern 132. In the second region B, the second insulation layer 140 may be formed on the liner layer 120.

The second insulation layer 140 may be formed of, e.g., a different material from the first insulation layer 130. According to an exemplary embodiment, the first insulation layer 130 may be formed of a nitride layer, and the second insulation layer 140 may be formed of a non-nitride layer. For example, the first insulation layer 130 may be formed of a silicon nitride layer, and the second insulation layer 140 may be formed of a silicon oxide layer.

A thickness of the second insulation layer 140 may be, e.g., greater than half of the maximum width of the second trench 114. The thickness of the second insulation layer 140 may be measured in a direction perpendicular to the substrate 100. The second insulation layer 140 may fill, e.g., completely fill, an inner space surrounded by the liner layer 120 in the second trench 114. The second insulation layer 140 may fill a space above the first insulation pattern 132.

In an exemplary embodiment, the second insulation layer 140 may be formed using, e.g., a spin-on-glass (SOG) process or a flowable chemical vapor deposition (FCVD) process.

Figure 5:
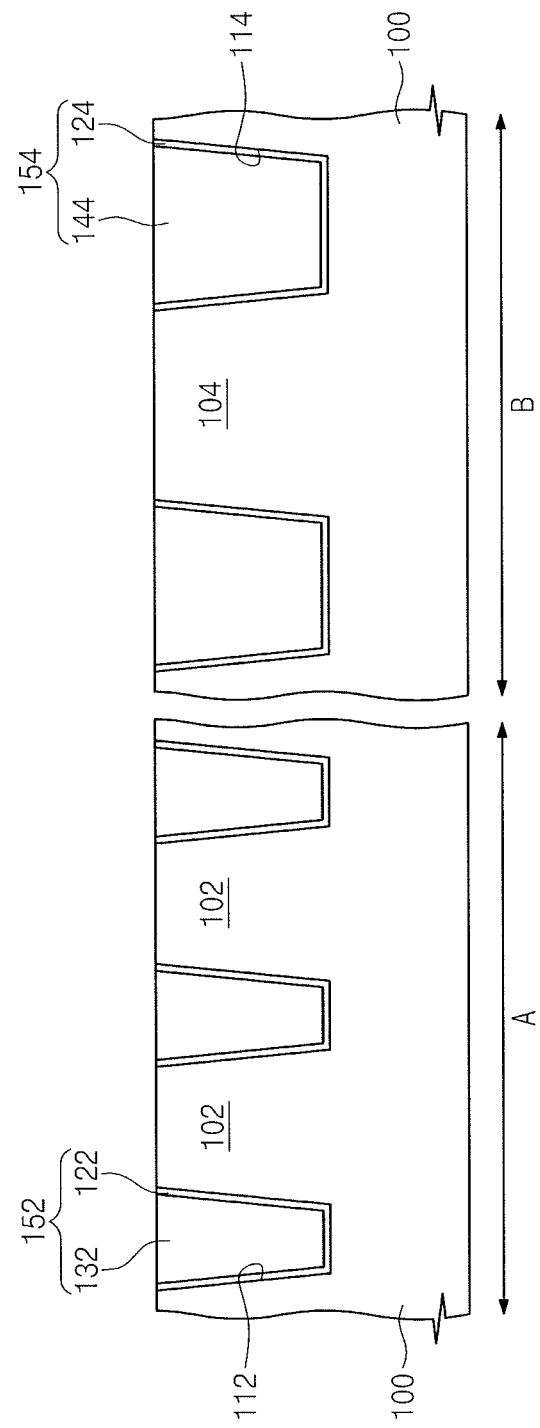

Referring to FIG. 5, the second insulation layer 140 located outside the first and second trenches 112 and 114 may be removed to form a second insulation pattern 144 in the second trench 114. The liner layer 120 located outside the first and second trenches 112 and 114 may be removed to form a first liner pattern 122 left in the first trench 112 and a second liner pattern 124 left in the second trench 114. The mask pattern 106 may then be removed to expose the top surface of the substrate 100.

The first insulation pattern 132 and the first liner pattern 122 remaining in the first trench 112 may constitute a first isolation pattern 152. The second insulation pattern 144 and the second liner pattern 124 remaining in the second trench 114 may constitute a second isolation pattern 154.

A plurality of first isolation patterns 152 may be provided, e.g., in the first region A. According to an exemplary embodiment, a first active portion 102 may be defined between adjacent first isolation patterns 152. The first active portion 102 may correspond to a portion of the substrate 100 that is surrounded by the adjacent first isolation patterns 152.

A plurality of second isolation patterns 154 may be provided, e.g., in the second region B. According to an exemplary embodiment, a second active portion 104 may be defined between adjacent second isolation patterns 154. The second active portion 104 may correspond to a portion of the substrate 100 that is surrounded by the adjacent second isolation patterns 154.

A semiconductor device formed according to an exemplary embodiment, e.g., the first exemplary embodiment, is described with reference to FIG. 5.

Referring again to FIG. 5, a substrate 100 including a first region A and a second region B is provided. The first region A may correspond to a cell region in which memory cells are formed, and the second region B may correspond to a peripheral region in which peripheral circuits are formed.

The substrate 100 in the first region A may include a first trench 112 having a first width, and the substrate 100 in the second region B may include a second trench 114 having a second width that is greater than the first width.

A first isolation pattern 152 may be disposed in the first trench 112. The first isolation pattern 152 may fill, e.g., completely fill, the first trench 112 that includes the first liner pattern 122. The first isolation pattern 152 may include a first insulation pattern 132 and a first liner pattern 122. The first liner pattern 122 may cover a bottom surface and a sidewall of the first trench 112. For example, the first liner pattern 122 may contact the bottom surface and the sidewall of the first trench 112. The first liner pattern 122 may be disposed between the first insulation pattern 132 and the substrate 100 defining the first trench 112.

The first insulation pattern 132 may cover the first liner pattern 122, e.g., may contact the first liner pattern 122. The first insulation pattern 132 may fill, e.g., completely fill, a space surrounded by the first liner pattern 122 in the first trench 112. The first insulation pattern 132 may be formed of a different material from the first liner pattern 122. According to an exemplary embodiment, the first insulation pattern 132 may be formed of a nitride layer, and the first liner pattern 122 may be formed of a non-nitride layer. For example, the first insulation pattern 132 may be formed of a silicon nitride layer and the first liner pattern 122 may be formed of a silicon oxide layer.

A second isolation pattern 154 may be disposed in the second trench 114. The second isolation pattern 154 may fill, e.g., completely fill the second trench 114 that includes the second liner pattern 124. The second isolation pattern 154 may include a second insulation pattern 144 and a second liner pattern 124. The second liner pattern 124 may cover a bottom surface and a sidewall of the second trench 114. For example, the second liner pattern 124 may contact the bottom surface and the sidewall of the second trench 114. The second liner pattern 124 may be disposed between the second insulation pattern 144 and the substrate 100 defining the second trench 114.

The second insulation pattern 144 may contact the second liner pattern 124. The second insulation pattern 144 may fill, e.g., completely fill, a space surrounded by the second liner pattern 122 in the second trench 114. The second insulation pattern 144 may be formed of the same material as the second liner pattern 124. According to an exemplary embodiment, the second insulation pattern 144 and the second liner pattern 124 may be formed of a non-nitride layer. For example, the second insulation pattern 144 and the second liner pattern 124 may be formed of a silicon oxide layer.

According to an exemplary embodiment, e.g., as described above, the first trench 112 may be filled with the first insulation pattern 132 formed of a nitride layer that exhibits an etch-resistant characteristic during a subsequent etching process or a subsequent cleaning process. In the event that the first insulation pattern 132 is formed of a non-nitride layer, e.g., a silicon oxide layer, the first insulation pattern 132 may be recessed during the subsequent etching process or the subsequent cleaning process. However, without intending to be bound by this theory, the first isolation pattern 152 including the first insulation pattern 132 formed of a nitride layer may reduce the possibility of and/or prevent the first insulation pattern 132 from being recessed, e.g., during the subsequent etching process or the subsequent cleaning process. Thus, a reliable semiconductor device may be realized.

Further, the second trench 114 may be filled with the second insulation pattern 144 formed of a non-nitride layer. Without intending to be bound by the theory, in the event that at least one of the second insulation pattern 144 and the second liner pattern 124 is formed of a nitride layer, e.g., a silicon nitride layer, it may be difficult to form an element in the second trench 114. For example, if the second insulation pattern 144 or the second liner pattern 124 is formed of a nitride layer, it may be difficult to form a contact hole penetrating the second insulation pattern 144 or the second liner pattern 124 together with another contact penetrating an interlayer dielectric layer formed of an oxide layer. However, according to an exemplary embodiment, the second insulation pattern 144 and the second liner pattern 124 may be formed of an oxide layer. Thus, it may be easier to form other elements such as contact structures in the second trench 114.

The first isolation pattern 152 formed in the first trench 112 may have various shapes in a plan view. The various shapes of the first isolation pattern 152 will be described hereinafter with reference to FIGS. 6A and 6B.

Figure 6A:
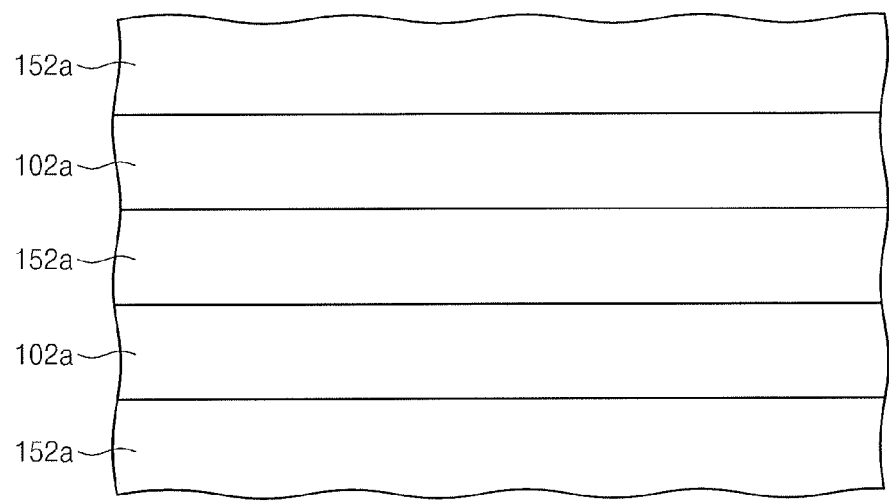
FIG. 6A illustrate a plan view of an example of first isolation patterns in a semiconductor device, according an exemplary embodiment.

FIG. 6A illustrates a plan view of exemplary first isolation patterns in a semiconductor device according to an exemplary embodiment.

Referring to FIG. 6A, an isolation pattern 152a may be disposed to extend in a second direction. The second direction may be parallel to the substrate 100 and may be perpendicular to the first direction that defines a width of the isolation pattern 152a. The isolation pattern 152a may correspond to the first isolation pattern 152 described with reference to the embodiments, e.g., the exemplary embodiment illustrated in FIG. 5. The number of the isolation patterns 152a on the substrate 100 may be two or more. The plurality of isolation patterns 152a may be spaced apart from each other in the first direction and may extend in the second direction.

Active portions 102a may be defined between the adjacent isolation patterns 152a. The active portions 102a may correspond to the first active portions 102 in embodiments, e.g., the exemplary embodiment described with reference to FIG. 5. The active portions 102a may be spaced apart from each other in a plan view. The active portions 102a may extend in the second direction, e.g., the active portions 102a may extend in a direction parallel to the extending directions of the adjacent isolation patterns 152a.

Figure 6B:
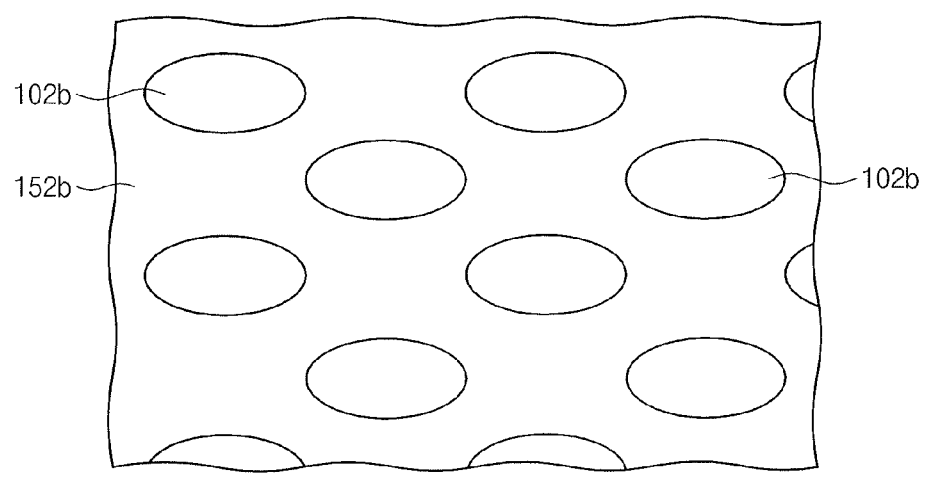
FIG. 6B illustrate a plan view illustrating another example of first isolation patterns in a semiconductor device, according to an exemplary embodiment.

FIG. 6B illustrates a plan view of other exemplary first isolation patterns in a semiconductor device according to an exemplary embodiment.

Referring to FIG. 6B, a plurality of active portions 102b may be defined by an isolation pattern 152b. The plurality of active portions 102b may be spaced apart from each other in a plan view. Each of the active portions 102b may correspond to respective portions of the substrate 100 that are surrounded by the isolation pattern 152b. The isolation pattern 152b and the active portions 102b may correspond to the first isolation pattern 152 and the first active portions 102, respectively, in the exemplary embodiments, e.g., as described with reference to FIG. 5.

A method of fabricating a semiconductor device according to a second exemplary embodiment will be described with reference to FIGS. 7 to 10.

Figure 7:
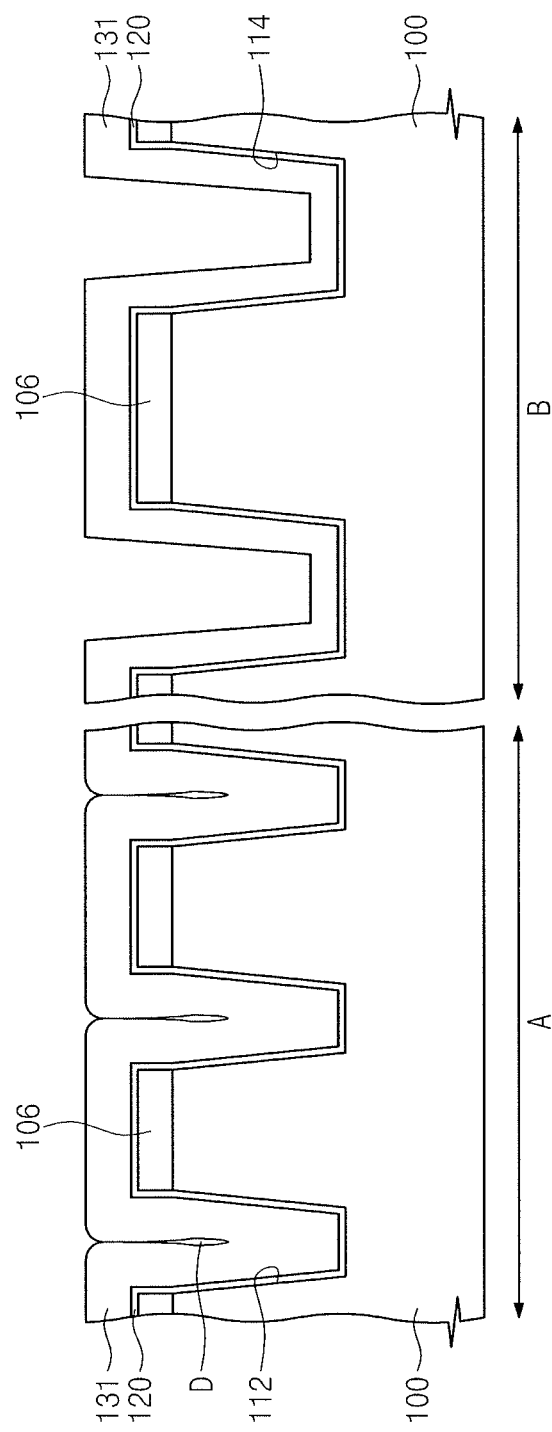
FIGS. 7 to 10 illustrate cross sectional views depicting stages in a method of fabricating a semiconductor device, according to an exemplary embodiment.

Referring to FIG. 7, a first trench 112 and a second trench 114 may be formed in a substrate 100 having a first region A and a second region B. The first trench 112 may be formed to have a first width in the first region A, and the second trench 114 may be formed to have a second width in the second region B. The second width may be greater than the first width. The first and second trenches 112 and 114 may be formed by etching the substrate 100 using a mask pattern 106 as an etch mask, as described with reference to FIG. 1.

A liner layer 120 may be formed on the substrate 100 having the first and second trenches 112 and 114. A thickness of the liner layer 120 may be less than a half of a minimum width of the first trench 112. For example, the liner layer 120 may be formed to conformally cover bottom surfaces and sidewalls of the first and second trenches 112 and 114. Therefore, inner spaces surrounded by the liner layer 120 may still exist in the first and second trenches 112 and 114. The liner layer 120 may be formed of an insulation layer. The liner layer 120 may be a non-nitride layer.

A first insulation layer 131 may be formed on the substrate having the liner layer 120. A thickness of the first insulation layer 131 may be less than a half of a minimum width of the second trenches 114. That is, the first insulation layer 131 may be formed to, e.g., conformally cover a surface of the liner layer 120 in the second trench 114. Therefore, an inner empty space surrounded by the first insulation layer 131 may still exist in the second trench 114.

The first insulation layer 131 may fill the first trench 112. In this case, defects D, e.g., including voids and/or seams, surrounded by the first insulation layer 131 may be formed in the first trench 112. For example, the defect D may be a void and/or seam in which the first insulation layer 131 is excluded and that is formed near a center of the first trench 112. The defect D may extend, e.g., be elongated, in a direction toward the bottom surface of the first trench 112.

The first insulation layer 131 may be formed of a different material from the liner layer 120. According to an exemplary embodiment, the liner layer 120 may be formed of a non-nitride layer (e.g., a silicon oxide layer), and the first insulation layer 131 may be formed of a nitride layer (e.g., a silicon nitride layer).

Figure 8:
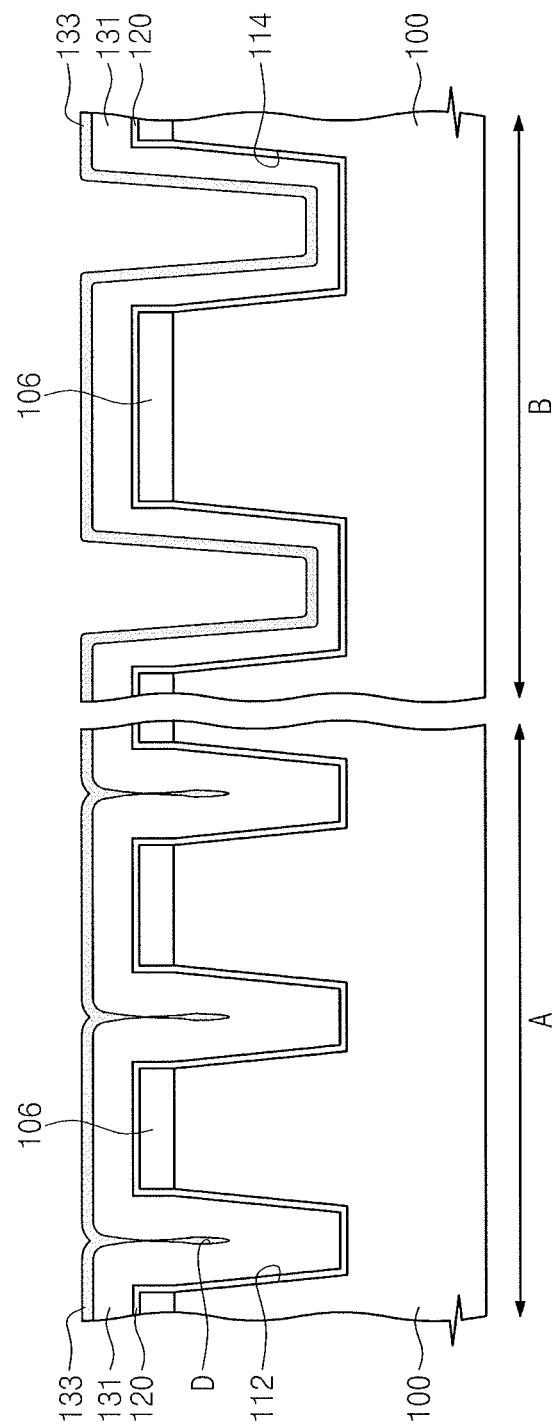

Referring to FIG. 8, a thermal oxidation process may be applied to the first insulation layer 131, thereby forming an assistant layer 133 on the first insulation layer 131. According to an exemplary embodiment, when the first insulation layer 131 is formed of a silicon nitride layer, the assistant layer 133 may include a silicon oxynitride layer. The assistant layer 133 may correspond to a surface layer of the first insulation layer 131 that is oxidized during the thermal oxidation process. The assistant layer 133 may fill the defects D, e.g., the assistant layer 133 may fill some of the defects D in upper and lower regions of the first trench 112. The first insulation layer 131 and the assistant layer 133 may completely and/or stably fill, e.g., completely fill, the first trench 112 that includes the liner layer 120. For example, the first trench 112 may be filled substantially without and/or without any voids and/or any seams.

Figure 9:
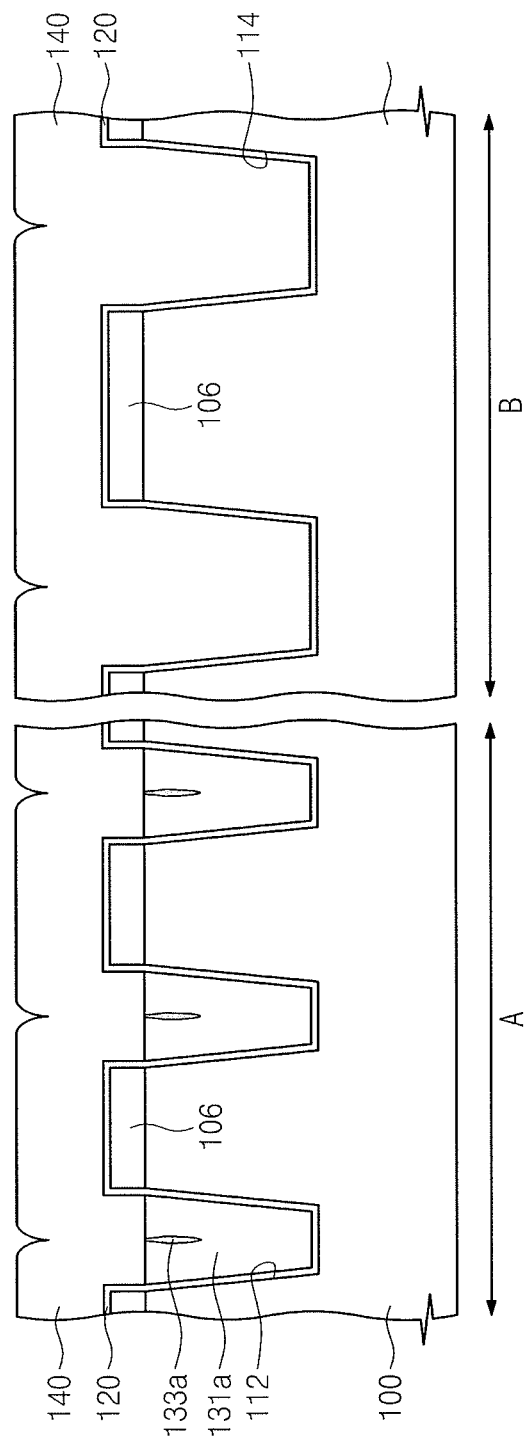

Referring to FIG. 9, the assistant layer 133 and the first insulation layer 131 in the second region B may be removed to expose the liner layer 120 in the second region B. During removal of the assistant layer 133 and the first insulation layer 131 in the second region B, a portion of the assistant layer 133 and a portion of the first insulation layer 131 in the first region A may also be removed to form a first insulation pattern 131a and an assistant pattern 133a remaining in the first trench 112. For example, upper portions of the assistant layer 133 and the first insulation layer 131 may be removed so that lower portions thereof remain in the first trench 112. In an exemplary embodiment, the first insulation layer 131 and the assistant layer 133 in the second region B may be removed using, e.g., a wet etching process.

The first insulation pattern 131a may correspond to a portion of the first insulation layer 131 that is left in the first trench 112. The assistant pattern 133a may correspond to a portion of the assistant layer 133 which is left in the first trench 112. The first insulation pattern 131a and the assistant pattern 133a may fill, e.g., completely fill, the inner empty space surrounded by the liner layer 120 in the first trench 112.

In an exemplary embodiment, top surfaces of the first insulation pattern 131a and the assistant pattern 133a may be at a level near a top surface of the substrate 100, e.g., the top surfaces may be substantially coplanar with the top surface of the substrate 100. In another exemplary embodiment, the top surfaces of the first insulation pattern 131a and the assistant pattern 133a may be located at a higher level than the top surface of the substrate 100.

The first insulation layer 131 and the assistant layer 133 in the second trench 114 may be removed, e.g., completely removed. Thus, the liner layer 120 in the second trench 114 may be exposed after formation of the first insulation pattern 131a and the assistant pattern 133a in the first trench 112.

A second insulation layer 140 may be formed on the substrate 100 having the first insulation pattern 131a and the assistant pattern 133a. The second insulation layer 140 may be formed of a different material from the first insulation layer 131. In an exemplary embodiment, the first insulation layer 131 may be formed of a nitride layer, and the second insulation layer 140 may be formed of a non-nitride layer. For example, the first insulation layer 131 may be formed of a silicon nitride layer, and the second insulation layer 140 may be formed of a silicon oxide layer.

A thickness of the second insulation layer 140 may be greater than a half of a maximum width of the second trench 114. Thus, the second insulation layer 140 may fill, e.g., completely fill, the inner space surrounded by the liner layer 120 in the second trench 114.

Figure 10:
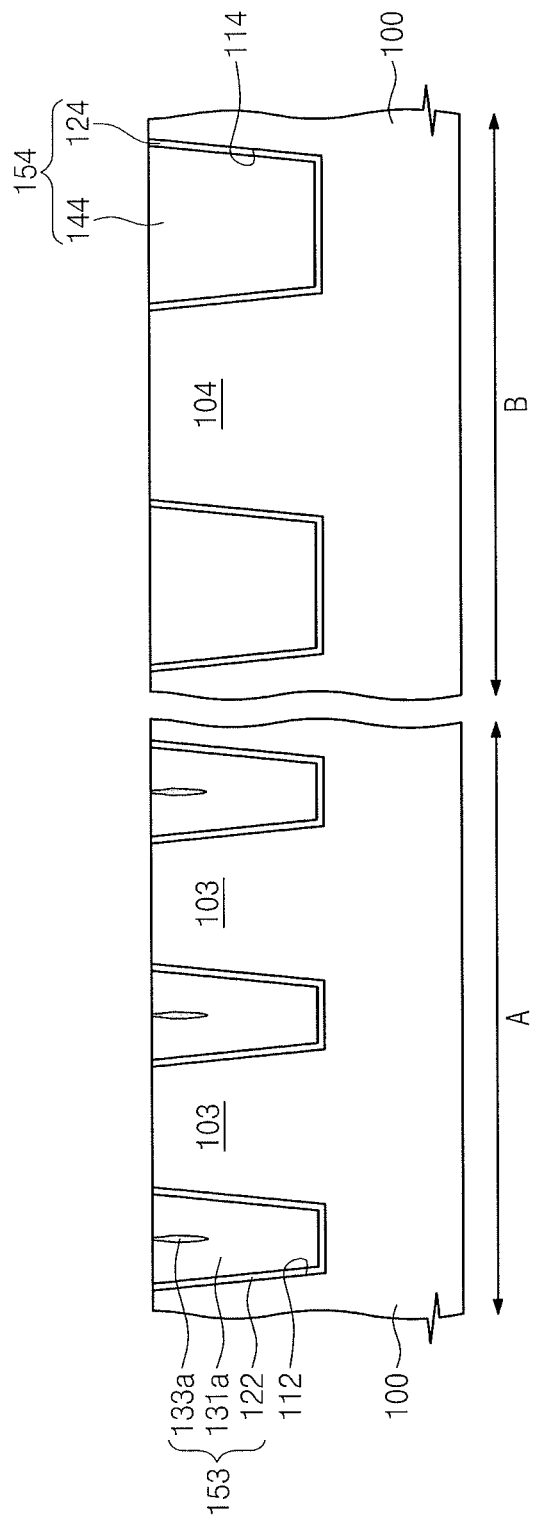

Referring to FIG. 10, the second insulation layer 140 located outside the first and second trenches 112 and 114 may be removed to from a second insulation pattern 144 in the second trench 114. The liner layer 120 located outside the first and second trenches 112 and 114 may also be removed to form a first liner pattern 122 in the first trench 112 and a second liner pattern 124 in the second trench 114. Further, the mask pattern 106 may be removed to expose the top surfaces of the substrate 100.

The first insulation pattern 131a, the assistant pattern 133a, and the first liner pattern 122 in the first trench 112 may constitute a first isolation pattern 153. The second insulation pattern 144 and the second liner pattern 124 in the second trench 114 may constitute a second isolation pattern 154.

The first isolation pattern 153 may be provided in a plurality, e.g., as described with reference to FIGS. 6A and 6B with respect to first isolation patterns 152a and 152b. At least one first active portion 103 may be defined between the adjacent first isolation patterns 153, e.g., the first action portion 103 may correspond to the first active portions 102 in FIGS. 6A and 6B. The first active portion 103 may correspond to a portion of the substrate 100 that is surrounded by the first isolation patterns 153. As described with reference to FIGS. 5 and 10, the second isolation pattern 154 may be provided in a plurality. At least one second active portion 104 may be defined between the adjacent second isolation patterns 154.

A semiconductor device formed according to the second exemplary embodiment will be described with reference to FIG. 10.

Referring again to FIG. 10, a substrate 100 including a first region A and a second region B may be provided. The substrate 100 in the first region A may include a first trench 112 having a first width, and the substrate in the second region B may include a second trench 114 having a second width that is greater than the first width.

A first isolation pattern 153 may be disposed in the first trench 112. The first isolation pattern 153 may completely fill the first trench 112 that includes the first liner pattern 122. The first isolation pattern 153 may include a first insulation pattern 131a, an assistant pattern 133a, and a first liner pattern 122. The first liner pattern 122 may be disposed in the first trench 112, e.g., as described with reference to FIGS. 2 and 7.

The first insulation pattern 131a may contact the first liner pattern 122. The first insulation pattern 131a may fill a space surrounded by the first liner pattern 122 in the first trench 112.

The assistant pattern 133a may be surrounded by the first insulation pattern 131a in the first trench 112. The assistant pattern 133a may be spaced apart from the first liner pattern 122 by the first insulation pattern 131a disposed between the assistant pattern 133a and the first liner pattern 122. The assistant pattern 133a and the first insulation pattern 131a may completely fill an inner space surrounded by the first liner pattern 122 in the first trench 112.

The first insulation pattern 131a, the assistant pattern 133a and the first liner pattern 122 constituting the first isolation pattern 153 may be formed of different materials from one another. For example, the first insulation pattern 131a, the assistant pattern 133a, and the first liner pattern 122 may be formed of a silicon nitride layer, a silicon oxynitride layer, and a silicon oxide layer, respectively.

The first isolation pattern 153 may be provided in a plurality, e.g., as described with reference to FIGS. 6A and 6B with respect to first isolation patterns 152a and 152b, respectively. For example, the plurality of first isolation patterns 153 may be separated from each other and may extend in parallel in a direction, e.g., as illustrated in FIG. 6A. In this case, a plurality of active portions 103 may be provided as described with reference to FIG. 6A with respect to active patterns 102a. The plurality of first active portions 103 may be separated from each other and may extend in parallel in a plan view. According to another exemplary embodiment, the first isolation pattern 153 may define a plurality of first active portions 103 that are separated from each other, e.g., as illustrated in the plan view of FIG. 6B with respect to first isolation patterns 152b.

A second isolation pattern 154 may be disposed in the second trench 114, e.g., as described with reference to FIGS. 9 and 10. The isolation patterns according to the above exemplary embodiments may be employed in semiconductor memory devices. The semiconductor memory devices including the isolation patterns according to exemplary embodiments will be described hereinafter.

Figure 11:
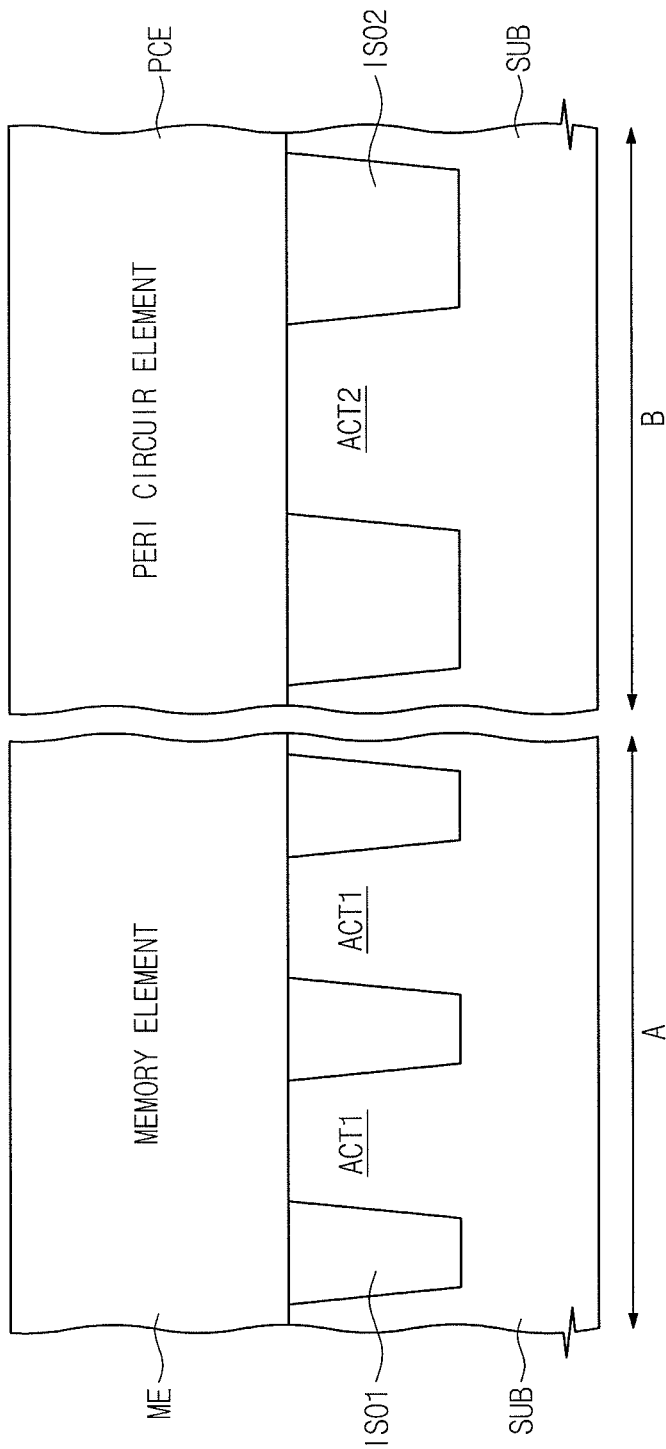
FIG. 11 illustrates a schematic cross sectional view of a semiconductor memory device including isolation patterns formed according to exemplary embodiments.

FIG. 11 illustrates a schematic cross sectional view of a semiconductor memory device including isolation patterns formed according to exemplary embodiments.

Referring to FIG. 11, a substrate SUB may include a first region A and a second region B. The substrate SUB may correspond to the substrate 100 described with reference to, e.g., FIG. 1.

First isolation patterns ISO1 may be disposed in the substrate SUB of the first region A. The first isolation patterns ISO1 may correspond to the first isolation patterns 152 illustrated in FIG. 5 or the first isolation patterns 153 illustrated in FIG. 10.

First active portions ACT1 may be defined between the first isolation patterns ISO1. The first active portions ACT1 may correspond to the first active portions 102 illustrated in FIG. 5 or the first active portions 103 illustrated in FIG. 10.

Second isolation patterns ISO2 may be disposed in the substrate SUB of the second region B. The second isolation patterns ISO2 may correspond to the second isolation patterns 154 illustrated in FIG. 5 and FIG. 10.

Second active portions ACT2 may be defined between the second isolation patterns ISO2. The second active portions ACT2 may correspond to the second active portions 104 illustrated in FIG. 5 and FIG. 10.

Memory elements ME may be disposed on, e.g., overlapping, the first region A of the substrate SUB. Each of the memory elements ME may correspond to a medium that stores a single bit data or multi bit data. The memory element ME may have, e.g., a logical data by storing charges therein or varying an electrical resistance thereof.

Peripheral circuit elements PCE may be disposed on, e.g., overlapping, the second region B of the substrate SUB. The peripheral circuit elements PCE may include elements for driving the memory elements ME.

In an exemplary embodiment, the memory elements ME may include, e.g., a variable resistive pattern. The peripheral circuit elements PCE may include, e.g., a capacitor that constitutes a pumping circuit for driving a memory cell including the variable resistive pattern. A semiconductor memory device including the variable resistive patterns will be described with reference to FIG. 12.

Figure 12:
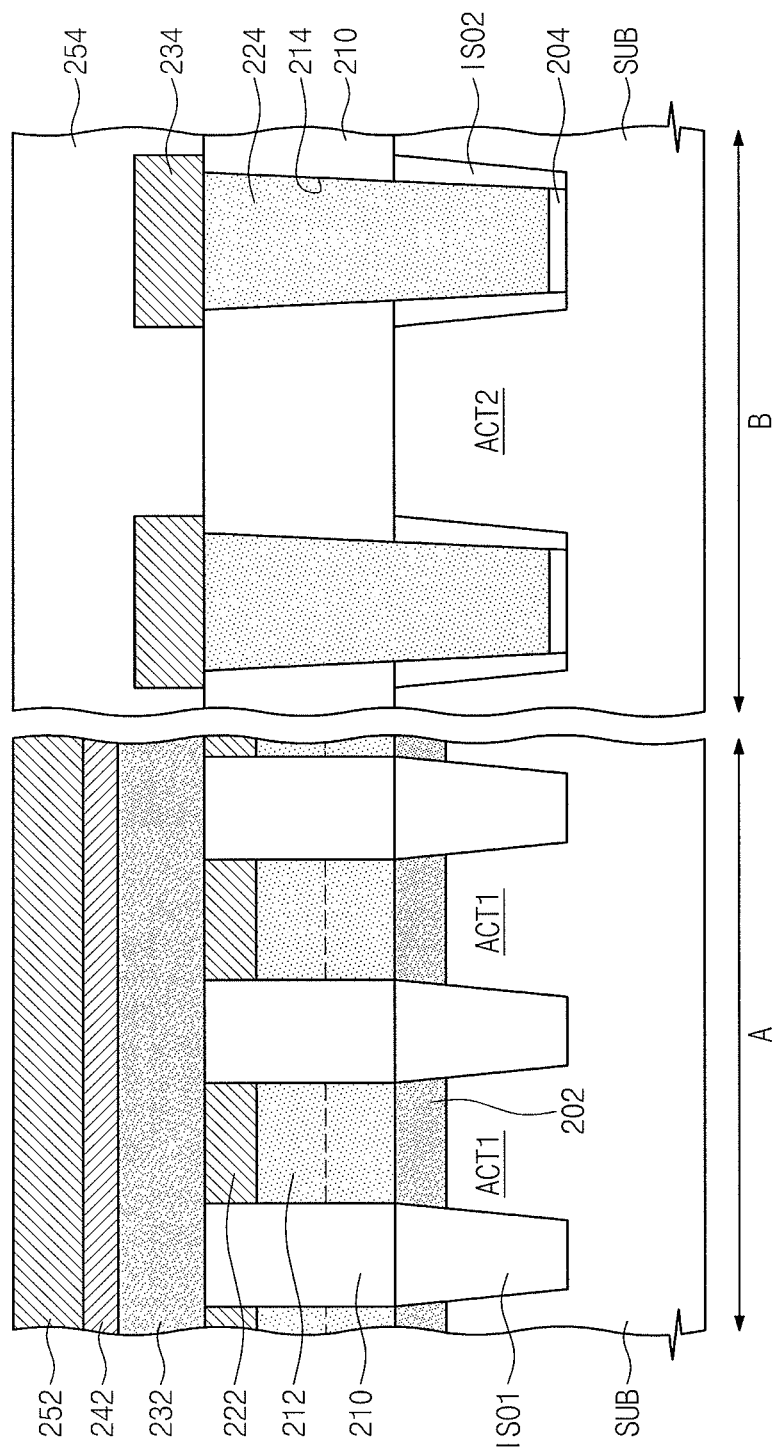
FIG. 12 illustrates a cross sectional view of a resistive memory device including isolation patterns, according to exemplary embodiments.

FIG. 12 illustrates a cross sectional view of a resistive memory device including isolation patterns according to exemplary embodiments.

Referring to FIG. 12, a substrate SUB including the first and second isolation patterns ISO1 and ISO2 and the first and second active portions ACT1 and ACT2 may be provided. The first isolation patterns ISO1 and the first active portions ACT1 may have line shapes extending in a second direction, e.g., as described with reference to FIG. 6A.

Memory elements including variable resistive patterns may be disposed on the substrate SUB of the first region A. Descriptions to the first region A will be developed hereinafter.

Impurity regions 202 may be disposed in the first active regions ACT1, respectively. Each of the impurity regions 202 may include, e.g., a metal-semiconductor compound material. Each of impurity regions 202 may include one of, e.g., an N-type region doped with N-type dopants or a P-type region doped with P-type dopants. The impurity regions 202 may correspond to word lines.

A first interlayer dielectric layer 210 may be disposed on the substrate having the impurity regions 202. The first interlayer dielectric layer 210 may be formed on the first isolation patterns ISO1. The first interlayer dielectric layer 210 may include, e.g., an oxide layer, a nitride layer, and/or an oxynitride layer.

A plurality of first semiconductor pillars 212 may penetrate the first interlayer dielectric layer 210. The first semiconductor pillars 212 may overlap, e.g., entirely overlap, respective ones of the impurities regions. The first semiconductor pillars 212 may be electrically connected, e.g., directly connected, to respective ones of the impurity regions 202. Each of the first semiconductor pillars 212 may include a first doped region and a second doped region which are sequentially stacked. The first doped region may have a different conductivity type from the second doped region. For example, the first and second doped regions of one first semiconductor pillar 212 may be in direct contact with each other to constitute a PN diode. However, embodiments are not limited thereto.

Lower electrodes 222 may be disposed on, e.g., to entirely overlap, respective ones of the first semiconductor pillars 212. The lower electrodes 222 may be disposed in the first interlayer dielectric layer 210. The first semiconductor pillars 212 under the lower electrodes 222 may be disposed in the first interlayer dielectric layer 210 with the lower electrodes 222. The lower electrodes 222 may be electrically connected to upper portions, e.g., the second doped regions, of respective ones of the first semiconductor pillars 212, respectively. Each of the lower electrodes 222 may include a conductive metal nitride material. For example, the lower electrodes 222 may include a titanium nitride layer, a tantalum nitride layer, and/or a titanium-aluminum nitride layer.

Although not shown in the drawings, ohmic patterns may be disposed between the lower electrodes 222 and the first semiconductor pillars 212. The ohmic patterns may be disposed to, e.g., provide electrical ohmic contacts between the lower electrodes 222 and the first semiconductor pillars 212.

A variable resistive pattern 232 may be disposed to cover the lower electrodes 222. The variable resistive pattern 232 may have a line shape extending in the first direction, e.g., so that the variable resistive pattern 232 has a plurality of the lower electrodes 222 thereunder. Alternatively, the variable resistive pattern 232 may be disposed on each of the lower electrodes 222. For example, the variable resistive pattern 232 may be provided in a plurality. The variable resistive pattern 232 may include, e.g., a phase change material. The phase change material may include, e.g., at least one of tellurium (Te) and selenium (Se) corresponding to chalcogenide elements. According to an exemplary embodiment, the phase change material may further include, e.g., at least one of germanium (Ge), stibium (Sb), bismuth (Bi), lead (Pb), tin (Sn), silver (Ag), arsenic (As), sulfur (S), silicon (Si), phosphorus (P), oxygen (O), and nitrogen (N). For example, the variable resistive pattern 232 may include at least one of a Ge—Sb—Te compound material, an As—Sb—Te compound material, an As—Ge—Sb—Te compound material, a Sn—Sb—Te compound material, a Ag—In—Sb—Te compound material, a In—Sb—Te compound material, a 5A group element—Sb—Te compound material, a 6A group element—Sb—Te compound material, a 5A group element—Sb—Se compound material and a 6A group element—Sb—Se compound material.

An upper electrode 242 may be disposed on the variable resistive pattern 232. In the event that the variable resistive pattern 232 has a line shape, the upper electrode 242 may extend in the first direction so as to be parallel with the variable resistive pattern 232. In the event that the variable resistive patterns 232 are formed to have a plurality of island shapes, a plurality of upper electrodes 242 may be disposed on respective ones of the variable resistive patterns 232. Each of the upper electrodes 242 may include, e.g., a conductive metal nitride material (e.g., a titanium nitride layer, a tantalum nitride layer, and/or a titanium-aluminum nitride layer).

A bit line 252 may be disposed on the upper electrode 242. The bit line 252 may extend in the first direction so as to be parallel with the variable resistive pattern 232. The bit line 252 may include, e.g., a tungsten material, an aluminum material, and/or a copper material. Although not shown in the drawings, the upper electrode 242 and the bit line 252 may be connected to each other through, e.g., a contact plug.

Peripheral circuit elements including capacitors may be disposed on the substrate SUB of the second region B. Descriptions to the second region B will be developed hereinafter.

Contact holes 214 may be formed to penetrate the first interlayer dielectric layer 210 and the second isolation patterns ISO2. The contact holes 214 may expose the bottom surface of the second trenches 114. The contact holes 214 may be filled with respective ones of second semiconductor pillars 224. For example, upper portions of the contact holes 214, which are surrounded by the first interlayer dielectric layer 210, may be completely filled with the second semiconductor pillars 224. Lower portions of the contact holes 214, which are surrounded by the second isolation patterns ISO2, may be partially filled with the second semiconductor pillars 224. In the event that each of the second isolation patterns ISO2 includes the second liner pattern 124 and the second insulation pattern 144 described with reference to FIG. 5 or FIG. 10, the contact holes 214 may penetrate the second liner patterns 124 and the second insulation patterns 144 to expose portions of bottom surfaces of the second trenches 114.

When each of the second isolation patterns ISO2 includes a nitride layer, it may be difficult to form the contact holes 214 penetrating the second isolation patterns ISO2. However, according to the embodiments, the second isolation patterns ISO2 may be formed of a non-nitride layer, e.g., a silicon oxide layer. Thus, the contact holes 214 may be more easily formed.

Dielectric patterns 204 may be disposed between the second semiconductor pillars 224 and bottom surfaces of the second trenches 114. Each of the dielectric patterns 204 may include an oxide layer which is formed by, e.g., thermally oxidizing the bottom surface of the second trench 114.

Conductive interconnections 234 may be disposed on the first interlayer dielectric layer 210 in the second region B. The conductive interconnections 234 may be connected to the second semiconductor pillars 224. A second interlayer dielectric layer 254 may be disposed to cover the conductive interconnections 234. The second interlayer dielectric layer 254 may include, e.g., a silicon oxide layer, a silicon nitride layer, and/or a silicon oxynitride layer.

The second semiconductor pillar 224, the dielectric pattern 204 under the second semiconductor pillar 224, and the substrate SUB may constitute a capacitor. The capacitor may be provided in a plurality on the second region B. The capacitors may be included in a pump circuit for driving memory cells including the variable resistive pattern 232.

Figure 13:
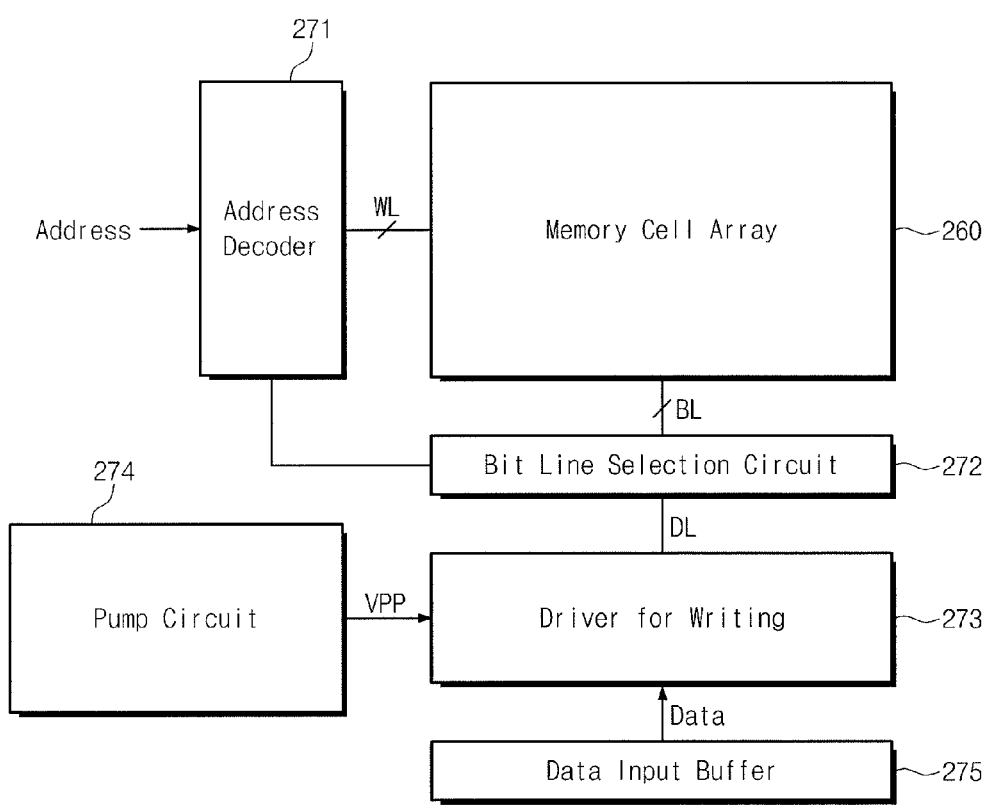
FIG. 13 illustrates a block diagram showing a semiconductor memory device including a pump circuit in which isolation patterns formed according to exemplary embodiments are employed.

FIG. 13 illustrates a block diagram of a semiconductor memory device including a pump circuit in which isolation patterns formed according to exemplary embodiments may be employed.

Referring to FIG. 13, the semiconductor memory device according to exemplary embodiments may include a memory cell array 260, an address decoder 271, a bit line selection circuit 272, a driver for writing 273, a pump circuit 274, and a data input buffer 275.

The memory cell array 260 may include memory cells, e.g., memory elements, that include the variable resistive patterns 232 described with reference to FIG. 12. The memory cells including the variable resistive patterns 232 may be connected to word lines WL and bit lines BL. The word lines WL may correspond to the impurity regions 202 illustrated in FIG. 12.

The address decoder 271 may receive row address signals and may select one of a plurality of word lines WL. Further, the address decoder 271 may receive column address signals and may provide the bit line selection circuit 272 with bit line selection signals. The bit line selection circuit 272 may electrically connect a data line DL (or a plurality of data lines DL) to a bit line BL (or a plurality of bit lines BL) selected from all the bit lines BL in response to the bit line selection signals from the address decoder 271.

The driver for writing 273 may receive data from the data input buffer 275 and may generate a program current such as a set current or a reset current that is transferred to the memory cells during a program operation. The driver for writing 273 may operate with a high voltage VPP generated from the pump circuit 274. The high voltage VPP may be higher than a power supply voltage, e.g., may be about 1.8 V.

The pump circuit 274 may include the capacitor described with reference to FIG. 12. The pump circuit 274 may generate the high voltage VPP that is higher than the power supply voltage. The high voltage VPP may be transferred to the driver for writing 273 so that, e.g., the phases of the variable resistive patterns 232 described with reference to FIG. 12 may be more easily changed. Thus, high reliable semiconductor devices may be provided.

In another exemplary embodiment, the memory elements ME may include cell capacitors, and the peripheral circuit elements PCE may correspond to a peripheral circuit for driving memory elements ME, e.g., memory cells, including the cell capacitors. A semiconductor memory device including the cell capacitors will be described with reference to FIG. 14.

Figure 14:
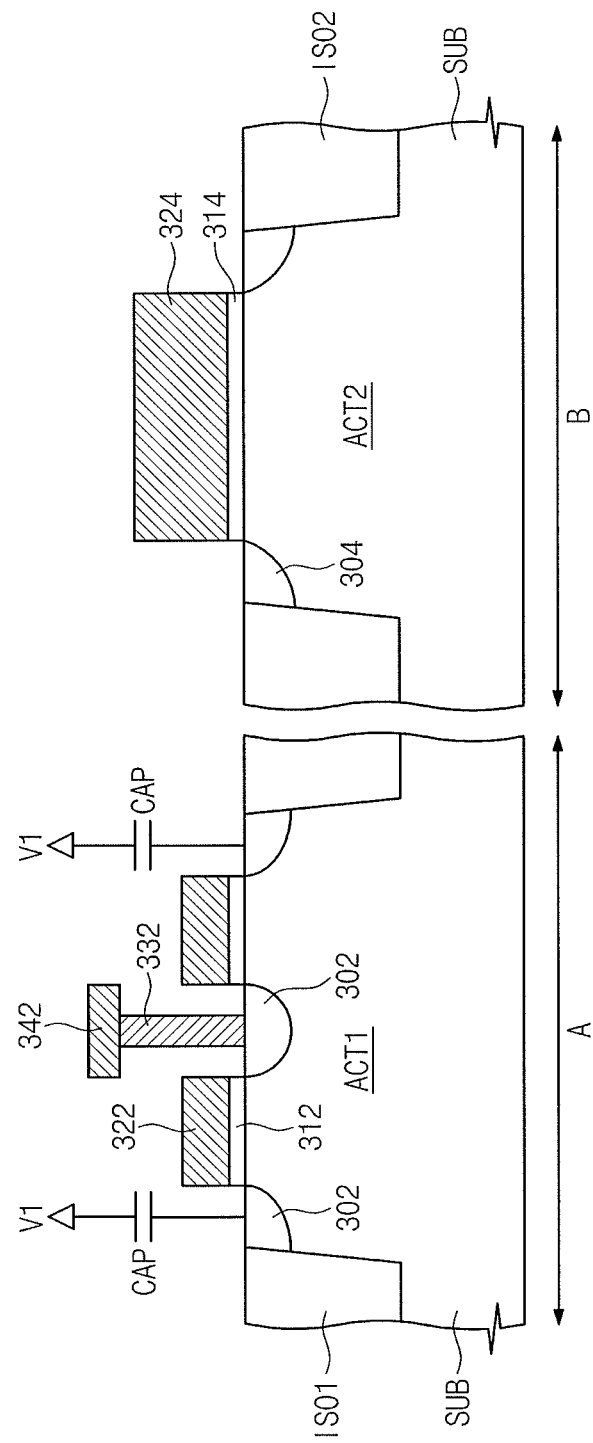
FIG. 14 illustrates a schematic cross sectional view showing a DRAM device including isolation patterns according to exemplary embodiments.

FIG. 14 illustrates a schematic cross sectional view of a semiconductor memory device including the cell capacitors and isolation patterns according to exemplary embodiments.

Referring to FIG. 14, a substrate SUB may be provided. The substrate SUB may include the first and second isolation patterns ISO1 and ISO2 and the first and second active portions ACT1 and ACT2, e.g., which are described with reference to FIG. 11. The first active portions ACT1 defined by the isolation patterns ISO1 may correspond to, e.g., the active portions 102b described with reference to FIG. 6B.

Memory cells including cell capacitors CAP may be disposed on the substrate SUB of the first region A. Descriptions to the first region A will be developed hereinafter.

At least one cell gate pattern, e.g., a pair of cell gate patterns may be disposed on the first active portion ACT1. Each of the cell gate patterns may include a cell gate insulation pattern 312 and a cell gate electrode 322 that are sequentially stacked. The cell gate insulation pattern 312 may include, e.g., a silicon oxide layer, a silicon nitride layer, and/or a silicon oxynitride layer. The cell gate electrode 322 may include, e.g., a doped silicon layer, a metal silicide layer, and/or a metal layer.

Cell source/drain regions 302 may be disposed in the substrate SUB. Each of the cell gate patterns may be disposed, e.g., on the first active portion ACT1 between the pair of source/drain regions 302. The cell source/drain regions 302 may correspond to regions of the substrate SUB that are doped with N-type dopants or P-type dopants.

The cell source/drain region 302 located at one side of the cell gate electrode 322 may be connected to a plug 332. A bit line 342 may be disposed on the plug 332. The cell source/drain region 302 located at the other side of the cell gate electrode 322 may be connected to one end of one of the cell capacitors CAP. A first voltage V1 may be applied to the other end of the respective cell capacitors CAP.

A peripheral circuit for driving the memory cells including the cell capacitors CAP may be disposed on the substrate SUB of the second region B. Descriptions to the second region B will be developed hereinafter.

A peripheral gate insulation pattern 314 and a peripheral gate electrode 324 may be disposed on the second active portion ACT2. The peripheral gate insulation pattern 314 may include, e.g., a silicon oxide layer, a silicon nitride layer, and/or a silicon oxynitride layer. The peripheral gate electrode 324 may include, e.g., a doped silicon layer, a metal silicide layer, and/or a metal layer.

A pair of peripheral source/drain regions 304 may be disposed in the second active portion ACT2. The peripheral gate insulation pattern 314 and the peripheral gate electrode 324 may be sequentially stacked on the second active portion ACT2 between the pair of peripheral source/drain regions 304. The peripheral source/drain regions 304 may correspond to, e.g., regions of the substrate SUB that are doped with N-type dopants or P-type dopants.

According to exemplary embodiments, each of the memory elements disposed on the substrate SUB of the first region A may include a variable resistive pattern or a cell capacitor. However, embodiments are not limited to the above exemplary embodiments. For example, memory elements other than the variable resistive pattern and the cell capacitor may be disposed on the substrate SUB of the first region A.

The semiconductor devices may be encapsulated using various packaging techniques. For example, the semiconductor devices may be encapsulated using any one of a package on package (POP) technique, a ball grid arrays (BGAs) technique, a chip scale packages (CSPs) technique, a plastic leaded chip carrier (PLCC) technique, a plastic dual in-line package (PDIP) technique, a die in waffle pack technique, a die in wafer form technique, a chip on board (COB) technique, a ceramic dual in-line package (CERDIP) technique, a plastic quad flat package (PQFP) technique, a thin quad flat package (TQFP) technique, a small outline package (SOIC) technique, a shrink small outline package (SSOP) technique, a thin small outline package (TSOP) technique, a system in package (SIP) technique, a multi chip package (MCP) technique, a wafer-level fabricated package (WFP) technique and a wafer-level processed stack package (WSP) technique. The package in which the semiconductor device according to one of the above embodiments is mounted may further include at least one additional semiconductor device, e.g., a controller and/or a logic device, that controls the semiconductor device.

Figure 15:
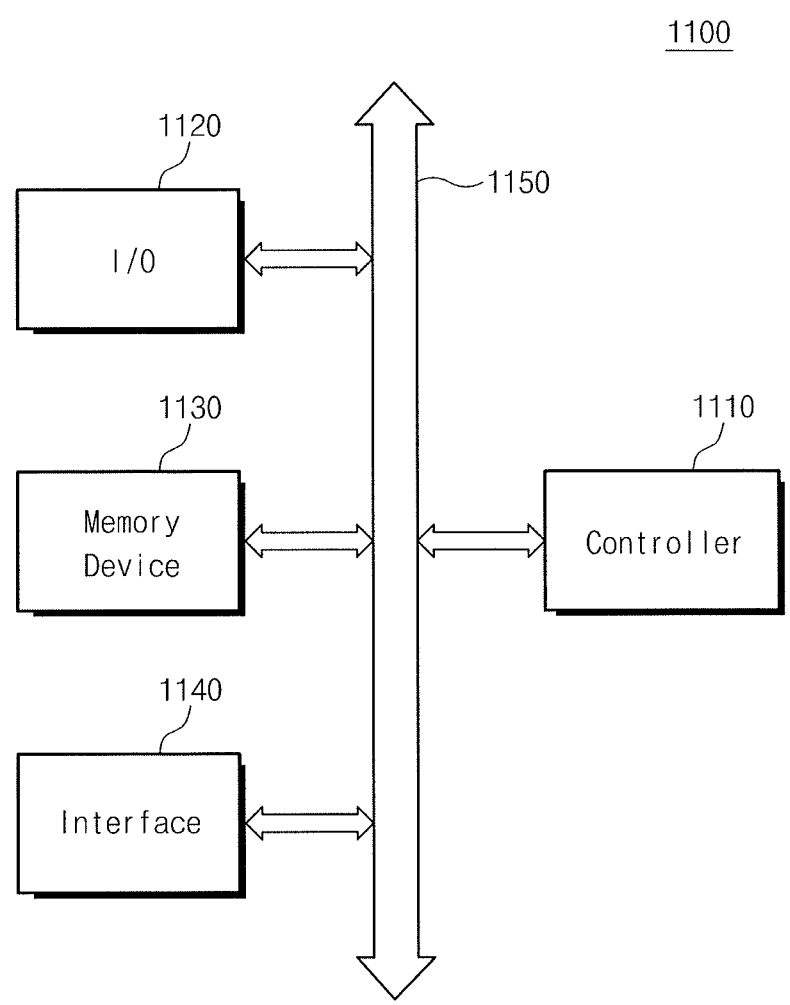
FIG. 15 illustrates a schematic block diagram showing exemplary electronic systems including semiconductor devices, according to exemplary embodiments.

FIG. 15 illustrates a schematic block diagram of exemplary electronic systems including the semiconductor devices according to exemplary embodiments.

Referring to FIG. 15, an electronic system 1100 according to an exemplary embodiment may include a controller 1110, an input/output (I/O) unit 1120, a memory device 1130, an interface unit 1140, and a data bus 1150. At least two of the controller 1110, the I/O unit 1120, the memory device 1130 and the interface unit 1140 may communicate with each other through the data bus 1150. The data bus 1150 may correspond to a path through which electrical signals are transmitted.

The controller 1110 may include at least one of a microprocessor, a digital signal processor, a microcontroller, or another logic device. The other logic device may have a similar function to any one of the microprocessor, the digital signal processor, and the microcontroller. The I/O unit 1120 may include a keypad, a keyboard, and/or a display unit. The memory device 1130 may store data and/or commands. The memory device 1130 may include a semiconductor memory device, e.g., at least one of the semiconductor memory devices according to the exemplary embodiments described above. The memory device 1130 may include another type of semiconductor memory devices that are different from the semiconductor memory devices described above. For example, the memory device 1130 may further include, e.g., a magnetic memory device, a phase change memory device, a dynamic random access memory (DRAM) device and/or a static random access memory (SRAM) device.

The interface unit 1140 may transmit electrical data to a communication network and/or may receive electrical data from a communication network. The interface unit 1140 may operate by, e.g., wireless or cable. For example, the interface unit 1140 may include an antenna for wireless communication or a transceiver for cable communication. Although not shown in the drawings, the electronic system 1100 may further include a fast DRAM device and/or a fast SRAM device that may act as a cache memory for improving an operation of the controller 1110.

The electronic system 1100 may be applied to, e.g., a personal digital assistant (PDA), a portable computer, a web tablet, a wireless phone, a mobile phone, a digital music player, or a memory card. The electronic system 1100 may be applied to another electronic product that receives or transmits information data by wireless or cable.

Figure 16:
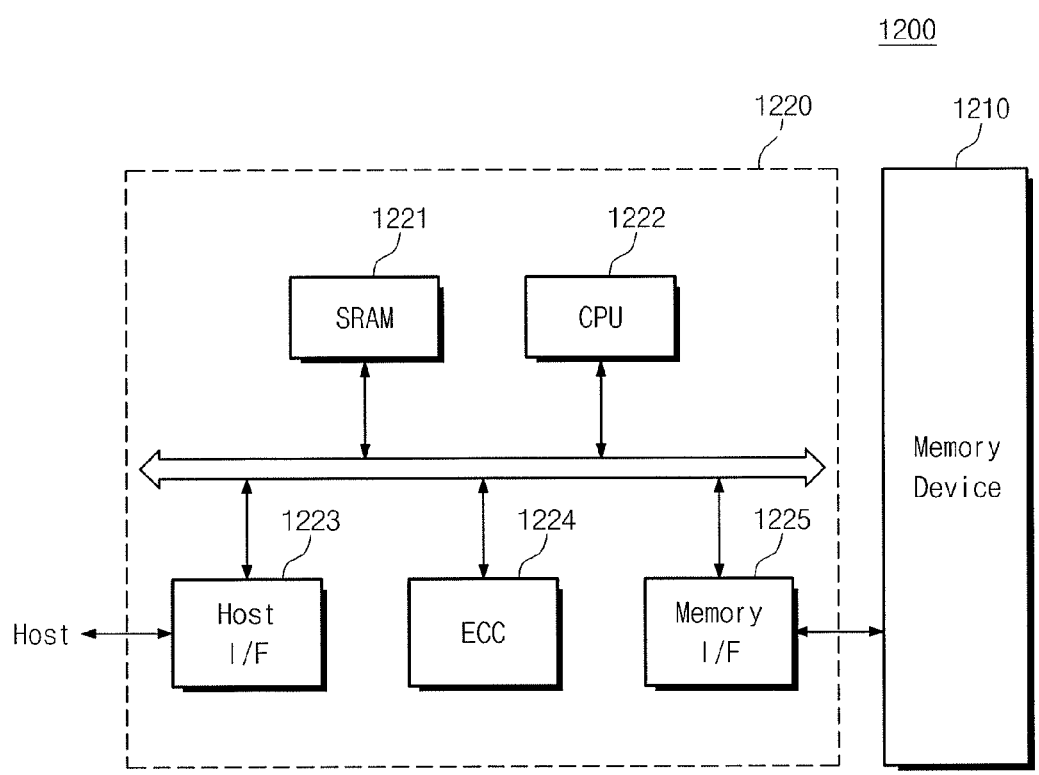
FIG. 16 illustrates a schematic block diagram showing exemplary memory cards including semiconductor devices, according to exemplary embodiments.

FIG. 16 illustrates a schematic block diagram of exemplary memory cards including the semiconductor devices according to the exemplary embodiments.

Referring to FIG. 16, a memory card 1200 according to an exemplary embodiment may include a memory device 1210. The memory device 1210 may include a semiconductor memory device, e.g., at least one of the semiconductor memory devices according to the various exemplary embodiments mentioned above. In other embodiments, the memory device 1210 may further include other types of semiconductor memory devices that are different from the exemplary embodiments described above. For example, the memory device 1210 may include, e.g., a magnetic memory device, a phase change memory device, a dynamic random access memory (DRAM) device and/or a static random access memory (SRAM) device. The memory card 1200 may include a memory controller 1220 that controls data communication between a host and the memory device 1210.

The memory controller 1220 may include a central processing unit (CPU) 1222 that controls overall operations of the memory card 1200. The memory controller 1220 may include an SRAM device 1221 used as, e.g., an operation memory of the CPU 1222. The memory controller 1220 may include a host interface unit 1223 and a memory interface unit 1225. The host interface unit 1223 may be configured to include a data communication protocol between the memory card 1200 and the host. The memory interface unit 1225 may connect the memory controller 1220 to the memory device 1210. The memory controller 1220 may further include an error check and correction (ECC) block 1224. The ECC block 1224 may, e.g., detect and correct errors of data that are read out from the memory device 1210. Even though not shown in the drawings, the memory card 1200 may further include a read only memory (ROM) device that stores code data to interface with the host. The memory card 1200 may be used as, e.g., a portable data storage card. The memory card 1200 may, e.g., replace hard disks of computer systems as solid state disks of the computer systems.

By way of summation and review, an increase of an integration density of semiconductor memory devices is sought so as to, e.g., lower the cost of the semiconductor memory devices. The integration density of the semiconductor memory devices may be determined by a planar area that a unit cell of the semiconductor memory devices occupies. As a result, the integration density of the semiconductor memory devices may be subject to process techniques for forming fine patterns. However, there may be some limitations in increasing the integration density of the semiconductor memory devices due to, e.g., high cost of equipment used in fabrication of the semiconductor memory devices and/or difficulties of fabrication processes.

In one isolation technique, both the cell trenches and the peripheral trenches may be filled with isolation patterns formed of an oxide material. In this case, some disadvantages may occur, e.g., to degrade reliability of a resultant semiconductor device. For example, when a pre-cleaning process for removing a native oxide layer on active regions is performed prior to formation of a cell gate oxide layer, the isolation patterns may be easily etched and/or recessed to form dent regions. The dent regions may lead to, e.g., an inverse narrow width effect.

In another isolation technique, the isolation patterns filling the cell trenches and the peripheral trenches may be formed of a nitride material. In this case, it may be difficult to form holes penetrating the peripheral isolation patterns using a conventional etching process for etching an oxide material. The holes may be provided to, e.g., make capacitors constituting charge pumping circuits for generating a high voltage.

In contrast, according to embodiments, e.g., the exemplary embodiments discussed above, a first trench having a first width is formed in a substrate of a first region, and a second trench having a second width greater than the first width is formed in the substrate of a second region. A first isolation pattern including a nitride material is disposed in the first trench, and a second isolation pattern including a non-nitride material is disposed in the second trench. Thus, it may be possible to reduce the possibility of and/or prevent the first isolation pattern from being recessed during a subsequent etching process or a subsequent cleaning process. Further, other elements such as contact plugs may be easily formed in the second trench filled with the non-nitride material. As a result, a high reliable and highly integrated semiconductor device may be realized. For example, the cell trenches may be filled with a nitride material having an etch selectivity with respect to an oxide material, and the peripheral trenches may be filled with an oxide material.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A method of fabricating a semiconductor device, the method comprising:
providing a substrate including a first region and a second region;
forming a first trench having a first width in the first region and a second trench having a second width in the second region, the second width being greater than the first width;
forming a first insulation layer in the first and second trenches, wherein the first insulation layer is formed to fill the first trench and to provide an empty space surrounded by the first insulation layer in the second trench;
removing the first insulation layer in the second trench to form a first insulation pattern that includes the first insulation layer remaining in the first trench; and
forming on the substrate a second insulation layer that fills the second trench, the second insulation layer including a different material from the first insulation layer.

2. The method as claimed in claim 1, wherein the first insulation layer is formed of a nitride material and the second insulation layer is formed of a non-nitride material.

3. The method as claimed in claim 1, further comprising forming a liner layer in the first and second trenches prior to forming the first insulation layer.

4. The method as claimed in claim 3, further comprising removing portions of the second insulation layer on the first region of the substrate to form a second insulation pattern that includes the second insulation layer remaining in the second trench.

5. The method as claimed in claim 4, further comprising:
forming a variable resistive pattern on the first region of the substrate; and
forming a semiconductor pillar in the second trench, the semiconductor pillar penetrating the second insulation pattern and the liner layer.

6. The method as claimed in claim 4, wherein:
the liner layer in the first trench and the first insulation pattern completely fill the first trench, and
the liner layer in the second trench and the second insulation pattern completely fill the second trench.

7. The method as claimed in claim 1, wherein:
the first trench is one of a plurality of first trenches,
the first trenches define active portions therebetween, and
top surfaces of the first insulation patterns are substantially coplanar with top surfaces of the active portions.

8. The method as claimed in claim 1, further comprising applying a thermal oxidation process to the first insulation layer to form an assistant layer on the first insulation layer.

9. The method as claimed in claim 8, wherein the assistant layer fills voids or seams that are surrounded by the first insulation layer in the first trench.

10. A method of fabricating a semiconductor device, the method comprising:
providing a substrate including a first region and a second region;
forming a first trench having a first width in the first region and a second trench having a second width in the second region, the second width being greater than the first width;
forming a nitride layer on the substrate to form a first nitride layer filling the first trench and a second nitride layer filling the second trench, wherein the second nitride layer is formed to provide an empty space surrounded by the second nitride layer in the second trench;
removing the second nitride layer from the second trench such that the first nitride layer remains in the first trench; and
forming a non-nitride layer filling the second trench after removing the second nitride layer from the second trench.

11. The method as claimed in claim 10, further comprising forming a liner layer in the first and second trenches before forming the nitride layer and the non-nitride layer.

12. The method as claimed in claim 11, further comprising oxidizing the first nitride layer to form an assistant layer such that the liner layer, the first nitride layer, and the assistant layer completely fill the first trench.

13. The method as claimed in claim 12, further comprising:
forming a memory element on the first region of the substrate, the memory element overlapping the first trench; and
forming a peripheral circuit element on the second region of the substrate, the peripheral circuit element including a semiconductor pattern that penetrates the non-nitride layer.

14. The method as claimed in claim 10, further comprising removing portions of the non-nitride layer outside the second trench such that the non-nitride layer is excluded in the first trench, the nitride layer being excluded in the second trench.

* * * * *